(12) United States Patent
Zen-Ruffinen et al.

(10) Patent No.: US 12,114,458 B2
(45) Date of Patent: Oct. 8, 2024

(54) POWER DISTRIBUTION UNIT WITH A MODULAR CONSTRUCTION

(71) Applicant: Riedo Networks AG, Fribourg (CH)

(72) Inventors: Antoine Zen-Ruffinen, Chatel-St-Denis (CH); Julián Burella Pérez, Biel/Bienne (CH); Adrian Riedo, Muntelier (CH); Iacopo Giangrandi, Oron-le-Châtel (CH)

(73) Assignee: RIEDO NETWORKS AG, Fribourg (CH)

( * ) Notice: Subject to any disclaimer, the term of this patent is extended or adjusted under 35 U.S.C. 154(b) by 640 days.

(21) Appl. No.: 17/263,604

(22) PCT Filed: Jul. 27, 2018

(86) PCT No.: PCT/EP2018/070476
§ 371 (c)(1),
(2) Date: Jan. 27, 2021

(87) PCT Pub. No.: WO2020/020470
PCT Pub. Date: Jan. 30, 2020

(65) Prior Publication Data
US 2021/0298194 A1    Sep. 23, 2021

(51) Int. Cl.
*H05K 7/14* (2006.01)
*H04B 10/50* (2013.01)
*H04B 10/564* (2013.01)

(52) U.S. Cl.
CPC ......... *H05K 7/1492* (2013.01); *H04B 10/502* (2013.01); *H04B 10/564* (2013.01)

(58) Field of Classification Search
CPC ... H05K 7/1492; H04B 10/502; H04B 10/564
See application file for complete search history.

(56) References Cited

U.S. PATENT DOCUMENTS

| 7,891,993 B2 | 2/2011 | Huber et al. |
| 8,039,997 B2 | 10/2011 | Slessman |

(Continued)

FOREIGN PATENT DOCUMENTS

| EP | 2057718 B1 | 5/2012 |
| EP | 2615700 A1 | 7/2013 |

(Continued)

OTHER PUBLICATIONS

International Search Report and Written Opinion of the International Searching Authority in PCT/EP2018/070476 dispatched Jan. 30, 2020.

*Primary Examiner* — Anthony Q Edwards
*Assistant Examiner* — Hung Q Dang
(74) *Attorney, Agent, or Firm* — J-TEK LAW PLLC; Jeffrey D. Tekanic; Scott T. Wakeman

(57) ABSTRACT

A modular power distribution unit includes a power rail, a power input module, a control module, and a power output module. The power input module includes at least one power inlet which is connectable to a power source. The control module includes a microcontroller and at least one external communication interface to transfer data to and preferably also to receive data from external devices. The power output module includes at least one power socket and either a metering device for metering at least one power parameter or at least one switch configured to selectively interrupt the transmission of power between at least two contact elements of the power output module and the at least one power socket. The control module and the power output module each include at least one optical communication unit which sends and/or receives data from at least one neighboring module via optical signals.

20 Claims, 4 Drawing Sheets

(56) References Cited

U.S. PATENT DOCUMENTS

| | | |
|---|---|---|
| 9,147,982 B2 | 9/2015 | Smed |
| 9,991,682 B2 * | 6/2018 | Wickett ............... H05K 7/1492 |
| 2012/0307421 A1 | 12/2012 | Ewing et al. |

FOREIGN PATENT DOCUMENTS

| | | |
|---|---|---|
| WO | 2007082071 A2 | 7/2007 |
| WO | 2009117500 A2 | 9/2009 |

* cited by examiner

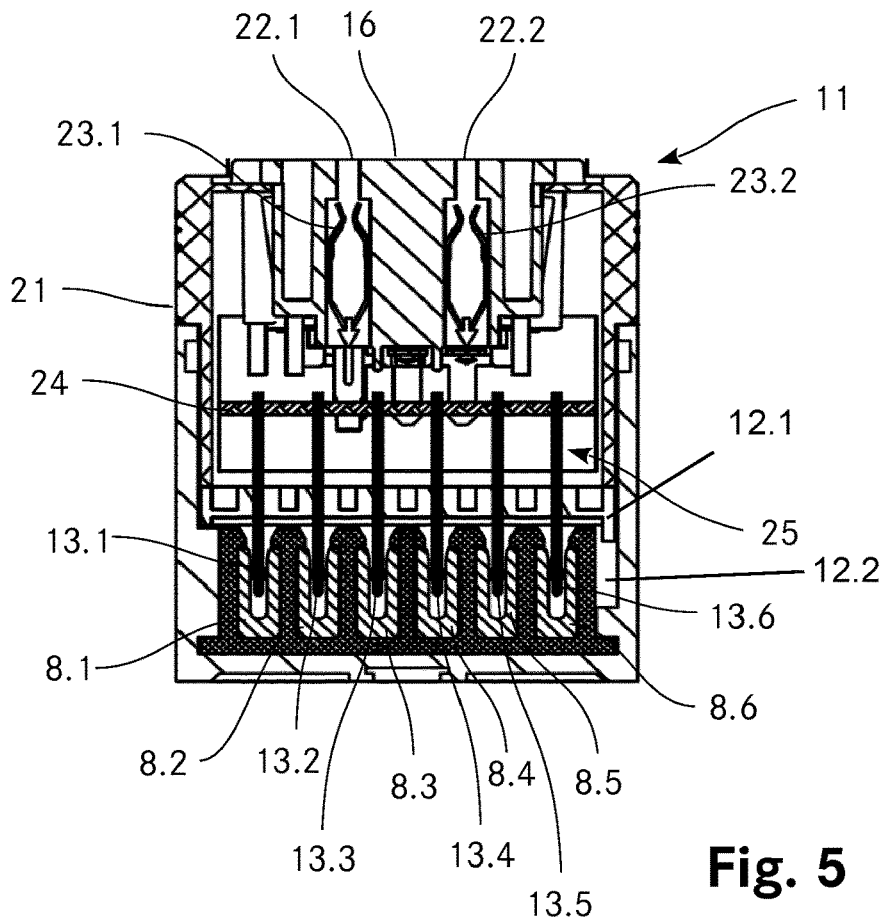
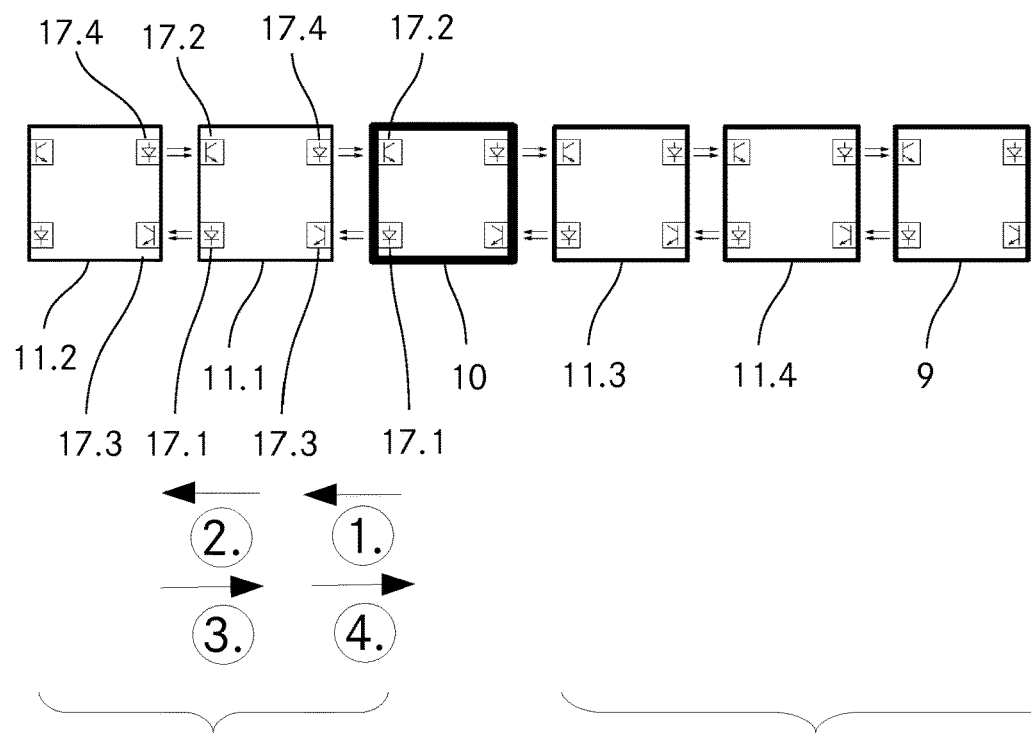
Fig. 5
Fig. 6

POWER DISTRIBUTION UNIT WITH A MODULAR CONSTRUCTION

CROSS-REFERENCE

This application is the U.S. National Stage of International Application No. PCT/EP2018/070476 filed on Jul. 27, 2018.

TECHNICAL FOLD

The invention relates to a power distribution unit with a modular construction, preferably for use in server racks. The power distribution unit comprises at least one control module, at least one power input module, as well as at least one power output module comprising a metering device for metering at least one power parameter of power provided to at least one power socket of the power output module.

BACKGROUND ART

Modular power distribution units are known in the art. For example, WO 2007/082071 (Server Technology Inc.) discloses modular power distribution units having interchangeable modules which allow a manufacturer to readily alter the configuration of a power distribution unit to support differing needs and applications. The power distribution unit may comprise one or more modules such as outlet modules, communications modules, circuit protection modules, power input modules and power metering or display modules. The modules may be electrically coupled together by means of terminals arranged on side walls of the modules. Alternatively, the modules may be electrically connected to each other by means of a wire harness which may also allow the connection of the modules to external devices. A customized power distribution unit configuration may be selected by an end user and subsequently assembled by the manufacturer. Any module may be easily removed and replaced without a complicated disassembly of the PDU.

WO 2009/117500 (Liebert Corporation) describes a power strip with a power rail having a power bus capable of distributing up to three phase AC power and a communication bus, said power bus including a plurality of power bus conductors and said communication bus including a plurality of communication bus conductors. The power rail may have a plurality of receptacle modules mounted on it, each receptacle module including a plurality of power terminals which mate with the power bus conductors and a plurality of plug adapters. The power rail further comprise a power entry module which may include a communications module which conducts a discovery process when a receptacle module is mounted on the power rail, wherein the communications module maintains in memory an inventory of each receptacle module mounted on the power rail including a unique identifier for each module as well as information indicative of the characteristics of each module. The communications module makes this information available to a display module coupled to the communications module or to a remote system via a network. The power entry module has a hot terminal for three phases (L1, L2, L3), a neutral terminal and a ground terminal. Further, the power entry module may also have a DC power supply that provides DC power to the communications module and to the power rail of the communication bus. The receptacle modules may have a metering function and may comprise a colour code that indicates a power configuration of the receptacle module. Each receptacle module distributes one of single phase AC power or polyphaser AC power to its plug receptacles and comprises a contact block with a plurality of blades which mate with respective slots in the power rail. By varying the number and configuration of the receptacle modules the adaptive power strip may be configured for a particular application.

EP 2 057 718 (Knurr GmbH) describes a power rail system which is easily adaptable and scalable. A base structure comprises a power bus which allows a free placement of energy modules along the entire length of the base structure by means of contact elements. The contact elements may comprise power rails. Energy modules having different plug forms and configurations may be used, e.g. also in terms of voltage or safety fuse. The base structure may also comprise a communication bus. Further, the power rail system may comprise a communication module which is in contact with the communication bus and which collects data from the energy modules. The communication module may be configured such that metering data for specific energy modules or even specific plugs of an energy module may be measured. The energy modules are preferably affixed to the base structure by means of a snap-fit connection. Additional optical output devices may be arranged on the modules, e.g. in the form of LEDs, in order to provide status information on the modules. The energy rail system is preferably configured such that a plurality of phases of AC current may be transmitted via the power bus. In one example, the power bus may comprise five power conductors and the communication bus at least four data conductors.

One drawback of the modular power distribution units as known in the art is that the power bus and the data bus must be galvanically isolated. Such a galvanic isolation makes the production of the base structure or housing more complicated and cost intensive.

SUMMARY OF THE INVENTION

It is the object of the invention to create a power distribution unit with a modular construction which allows the transfer of data between modules without the need to provide a galvanic separation of the power bus and data bus.

According to one aspect of the present disclosure, a power distribution unit having a modular construction comprises a power rail with a housing having an interior cavity. The housing includes at least one first connection element and a power bus having at least two conducting elements. The power distribution unit further comprises a plurality of modules which are formed and sized such as to be inserted into said interior cavity, wherein the modules may be arranged next to each other in said interior cavity. Each of said modules comprises at least one second connection element which cooperates with the at least one first connection element in order to releasably connect each module with the housing as well as at least two contact elements which may be brought into contact with said at least two conducting elements upon insertion of a module into said interior cavity. The plurality of modules includes a power input module comprising at least one power inlet which is connectable to a power source. The power input module further includes circuitry to relay power from the power inlet to the at least two contact elements of the power input module. Further, the modules include at least one control module including a microcontroller and at least one external communication interface to transfer data to and preferably also to receive data from external devices. Finally, the modules include at least one power output module, said at least one power output module comprising at least one power socket electrically connected to the at least two contact elements, as well as a metering device for metering at least one power parameter of the power transmitted from said at least two contact elements to said at least one power socket and/or at least one switch which allows to interrupt the power transmission from said at least two contact elements to said at least one power socket. The at least one control module and the at least one power output module comprising at least one optical communication unit which sends and/or receives data from at least one neighbouring module via optical signals.

By using optical signals sent or received by an optical communication unit only one electrical bus is used in the power distribution unit. Hence, galvanic isolation between the power circuitry and the control circuitry as known in the prior art may be omitted. Further, the housing of the power rail only has to accommodate the power bus thus allowing a reduction in size. Both these properties also allow reducing the complexity of the design and the production costs of the power rail. Further, the use of optical signals allows to easily vary the distance between the modules within a certain range, as the optical signals may relay data over varying distances.

Further, use of optical signals also allows the reliability of data transfer to be increased, as the occurrence of intermittent contacts caused by oxidation of metallic data transfer contacts or vibrations are eliminated. Additionally, as any "gap" occurring by the removal of a module from the power distribution unit may be bridged by the optical signal without difficulty, such a power distribution unit offers the possibility of "hot swapping" of any power output module.

A power distribution unit is used to distribute power to one or more electric devices which may be connected to the power distribution unit, e.g. by means of appropriate cables. The power distribution unit itself is connected to a power source, such as the mains electricity or any other suitable power source by appropriate means, e.g. by a cable.

The input power supplied to the power distribution unit by the power source may be single phase or polyphase AC or DC power. Accordingly, the power distributed to the one or more electric devices may be single phase or polyphase AC or DC power.

The power distribution unit may relay the power from the power source to the one or more electric devices without any further transformation of the power. Alternatively, the power distribution unit may comprise means to alter at least one property of the power, such as e.g. voltage or frequency. Further, the power distribution unit may comprise a rectifier such as to convert AC power to DC power or an inverter to convert DC to AC power.

The power distribution unit has a modular construction; this means that the power distribution unit may be configured to the specific needs of a user. For example, the number and type of power sockets may be adapted depending on the specific needs by using an appropriate number of power output modules with a specific type of power sockets. Further, by adding or removing certain types of modules, the power distribution unit may be further tailored to perform specific tasks and offer specific functionalities to a user. Preferably, the power distribution unit is assembled according to a user's needs by a manufacturer and then delivered to the user. The power distribution unit may be configured such that specific modules may be removed, added or exchanged at the site of the user, e.g. in the case of changing needs of the user or in case of a malfunction of one of the modules.

The housing preferably comprises a rectangular base wall and preferably side walls on all four sides of the rectangular base wall. As such, the housing forms an interior cavity with an open first side.

The power bus with the at least two conducting elements may for example be in the form of a cable harness with cables and connectors, such as sockets, which allow to connect the at least two contact elements (which in this case may be in the form of plugs) of the modules with the cables of the wire harness. Preferably, however, the at least two conducting elements are in the form of longitudinal bars of a conducting material, as will be explained in more detail further below. Preferably, said power bus is located within the interior cavity, more preferably on the base wall of the housing of the power rail.

In the case that AC power is being carried by the at least two conducting elements, the at least two conducting elements provide for a neutral conductor as well as at least one conductor for a live phase. In this case, the housing may be fully insulated or act as earth conductor. In the case that a DC power is being carried by the at least two conducting elements, the at least two conducting elements provide a ground conductor as well as a conductor for DC voltage. In this case, the housing may be fully insulated, act as an earth conductor or be connected to the ground conductor.

However, more preferably, the power bus comprises at least three conducting elements providing for a neutral and a ground (earth) conductor as well as for at least one live phase. Depending on the type of power (current) which is to be carried (conducted), the power bus may comprise more conducting elements, such as e.g. five conducting elements, providing for a neutral and for a ground (earth) conductor as well as respective conductors for three live phases. In certain embodiments, the power bus may comprise enough conducting elements in order to carry a single or polyphase AC as well as DC power. In this case, by providing power output modules with different configurations of the at least two contact elements so that each power output module can be provided either with AC power or with DC power, it is possible to provide a power distribution unit which is capable of distributing (conducting) AC power as well as DC power to one or more electric devices at the same time.

In the present application, the terminology "the modules" is meant to encompass the at least one control module, the power input module as well as the at least one power output module.

The modules preferably comprise the same number of contact elements as the number of conducting elements of the power rail. However, in certain embodiments, the modules may comprise less contact elements as the number of conducting elements of the power rail.

The modules are preferably sized and formed such that they may be inserted from the first side of the housing into the interior cavity. Specifically, the modules are dimensioned to occupy only a partial volume of the interior cavity, such that a multitude of modules may be inserted into said interior cavity. Preferably, said modules may be inserted into said interior cavity in several rows which lay next to each other along a first dimension of the base wall while a multitude of modules may be arranged next to each other along a second dimension of the base wall which is perpendicular to said first dimension. Therefore, a matrix like arrangement of a plurality of modules may be achieved in said interior cavity. The modules may partially protrude from said interior cavity: This means that any module may be dimensioned such that a part of said module protrudes out of said interior cavity, especially on said first side of the housing. Preferably, all modules are sized such that they all protrude from said interior cavity by an equal distance. However, in a preferred embodiment, the modules are sized such that they do not protrude from said interior cavity.

The modules preferably have an overall shape in the form of a cuboid or cube. Hence, the modules have a circumferential wall with four sides. Preferably, said four sides of each module have identical surfaces such as to allow the arrangement of all modules next to each other without a substantial gap forming between two neighbouring modules. In a further embodiment, the sides of each module are configured such that all modules may only be inserted into the interior cavity in a single orientation. For example, a first and a second side of the circumferential wall may comprise form-fit elements which only allow the arrangement of neighbouring modules in a way that the first side of a first module is next to the second side of a second, neighbouring module. Likewise, said third and said fourth side may comprise form-fit elements which only allows the arrangement of neighbouring modules in a way that the third side of the first module is next to the fourth side of a third, neighbouring module The at least one second connection element is designed such that it may cooperate with the at least one first connection element of the housing of the power rail, such as to form a releasable connection between said housing and a module. Preferably, said at least one first connection means and said at least one second connection means are configured to engage in a releasable form-fit connection, more preferably in the form of a snap-fit connection. Alternative form-fit connections may be realized by means of at least one screw or peg which may be inserted into at least one corresponding opening, in the form of at least one slider which may be moved into at least one corresponding opening or in the form of a loop and hook fastener. Further, in an alternative embodiment, the at least one first connection means and the at least one second connection means may be in the form of a force fit connection, e.g. in the form of at least one magnetic surface which adheres to at least one corresponding magnetisable or magnetic surface of the opposite pole or in the form of a releasable adhesive bond.

The at least two contact elements are configured in such a way as to be easily connected to or brought into contact with the at least two conductors. Thereby, the number of contact elements of a module preferably corresponds to the number of conducting elements of the power bus. Alternatively, however, any module may comprise less contact elements than the power bus has conducting elements. This allows transferring only a selected power to any module. For example, if the power bus comprises five conducting elements, e.g. for AC power having three phases L1, L2 and L3 as well as a neutral and an earth conductor, it is possible to design a module to specifically only contact the neutral and earth conductor as well as one phase, e.g. phase L1. The at least two contact elements may be in any suitable form to allow a releasable connection with or contact to the at least two conducting elements. For example, the at least two contact elements may be in the form of plugs, sockets, contact surfaces, pins, blades or any other suitable form.

The at least one power inlet of the power input module may comprise a cable or a socket, which may be connected to a cable, said cable being itself connectable to the power source. The power input module preferably comprises one power inlet. However, in some embodiments, the power input module may comprise more than one power inlet, such that the power input module may be connected to more than one power source. For example, the power input module may be additionally connected to a backup power source.

The circuitry to relay power from the power inlet to the at least two contact elements of the power input module may comprise cables to directly transfer power from the power inlet to the said at least two contact elements. In a preferred embodiment, said circuitry comprises means to alter at least one property of the power, such as e.g. voltage or frequency. Further, said circuitry may also comprise a rectifier such as to convert AC power to DC power or an inverter to convert DC to AC power. Further, the circuitry may comprise additional means to achieve one or several further functionalities, such as metering of a parameter of the power, an input filter, residual power monitoring, residual current breakers, overvoltage protection and others.

The at least two contact elements of the power input module act as power input for the at least two conducting elements of the power bus.

Preferably, the power distribution unit comprises one power input module. However, alternatively, the power distribution unit may comprise more than one power input module, such as two, three, four or more power input modules. Use of more than one power input module allows adding redundancy to the power distribution unit, as power supply may be ensured even in the case of a malfunction or removal of one power input module. Further, use of more than one power input module may allow increasing the total amount of power that the power distribution unit may supply to electric devices connected thereto.

The at least one external communication interface of the at least one control module may be a local area network (LAN) interface which allows data transfer via a local area network, for example according to the standard IEEE 802. Data transfer may thereby be carried out via a cable inserted into a corresponding plug provided on the external communication interface. Alternatively, data transfer may also be carried out wirelessly according to any of the IEEE 802.11 standards, e.g. via WiFi or Bluetooth®. Further, the external communication interface may allow the wireless transfer of data by means of optical signals. Alternatively, the external communication interface may be an interface for a fieldbus, such as for example Profibus, Ethercat®, or a powerline communication, etc. Further, the at least one external communication interface may be in the form of a universal serial bus (USB) allowing a hot-pluggable connection with an external computer.

The at least one control module preferably comprises more than one external communication interface. These external communication interfaces may be of the same type or alternatively the at least one control module may comprise external communication interfaces of different types, i.e. allowing the transfer of data with different communication standards.

Preferably, the at least one control module comprises a control unit, such as e.g. a microcontroller which allows to prepare, process and/or use data prior to their transfer or after their receipt via the at least one external communication interface.

The at least one control module preferably comprises a display, e.g. in the form of an LCD-display in order to display certain status information. The display may be in the form of a touch screen display such that an operator may select the type of information to be displayed or may enter certain data or commands via the touch screen. Preferably, the at least one control module may comprise an accelerometer in order to display any information on the display in a certain orientation.

Further, the at least one control module preferably comprises at least one digital or analogue interface for external sensors, e.g. such as a temperature sensor.

The at least one control module preferably comprises a power supply, such as a switching power supply, in order to power the at least one communication interface as well as the at least one control unit, the display or any external sensor connected to the at least one control module. Further, the power supply may be used to provide auxiliary power to further modules via at least one of the at least two conducting elements of the power bus. This feature will be explained in more detail further below.

The power distribution unit preferably comprises one control module. However, further preferably, the power distribution unit may comprise more than one control module, such as two, three, four or more control modules.

The at least one power output module comprises at least one power socket. The at least one power socket may be of any suitable type. For example, the at least one power socket may be in the form of an AC socket according to an IEC specification or NEMA specification, a DC connector, or an appliance coupler according to the IEC specification 60320, such as e.g. C13 or C19.

Preferably, the at least one power output module comprises more than one power socket, such as two, three, four or more power sockets. These power sockets may all be of the same type. Alternatively, a power output module may comprise power sockets of different types. In certain embodiments, however, a power output module may only comprise one power socket.

The at least one power socket is preferably electrically connected to the at least two contact elements by means of cables or conductive elements. The at least one power output module may either comprise at least one metering device which measures at least one parameter of the power transmitted from said at least two contact elements to said at least one power socket or at least one switch which allows to interrupt the transmission of power from said at least two contact elements to the at least one power socket. In an alternative embodiment, the at least one power output module comprises at least one metering device as well as at least one switch. It is understood that by means of said at least one switch the transmission of power between the at least two contact elements and the at least one power socket may not only be interrupted but may also be switched on (again) after an interruption. This allows to selectively switch electric devices connected to the power distribution unit on and off. The at least one switch may be in the form of a relay.

The metering device preferably measures at least one power parameter for each of the power sockets present on the power output module. Alternatively or additionally, the metering device may, however, measure at least one power parameter for all power sockets of the respective power output module. The at least one parameter preferably is at least one of voltage, amperage, and/or wattage.

The metering device is preferably powered by the power which is relayed from the at least two contact elements to the at least one power socket. More preferably, however, the at least one power output module comprises a power supply, such as a switching power supply to supply power to the metering device. Further preferably, said metering device is powered by an auxiliary power which is fed through at least one of said at least two conductors of the power bus, as explained in more detail further below.

Preferably, said at least one switch may be closed or opened in response to a specific signal included in the data received by the at least one optical communication unit of the respective power output module. Preferably, the at least one power output module comprises one switch for each of the power sockets present on the module, such that transmission of power between the at least two contact elements and each of the power sockets may be interrupted and switched on separately.

The at least one control module as well as the at least one power output module each comprise at least one optical communication unit which sends and/or receives data from at least one neighbouring module via optical signals when said modules are inserted into said interior cavity. Preferably, the at least one control module and the at least one power outlet module comprise two optical communication units, each of said optical communication units being able to send and to receive data via optical signals. The at least one optical communication unit on each module is positioned such that a direct line of sight is established between two modules that are inserted into the interior cavity adjacent to each other; i.e. the optical signals are transmitted through the air between the two adjacent (neighbouring) modules. This means that the optical communication units of each of the modules are positioned at the same location on each module, such that all optical communication units are aligned roughly on imaginary straight lines when the modules are inserted into the interior cavity. In a preferred embodiment, the at least one power output module and the at least one control module each comprise four optical communication units. Thereby a first and a second optical communication unit are arranged on the third side and a third and a fourth optical communication unit are arranged on the fourth side of the housing of the at least one power output module and of the at least one control module. The position of the optical communication units on each of the third and fourth side of the at least one power output module as well as of the control module is identical, so that when the modules are inserted into the interior cavity, the first optical communication unit of a module lies in a line-of-sight with the third optical communication unit of a neighbouring module while the second optical communication unit lies in a line-of-sight with the fourth optical communication of the neighbouring module.

In the case of a matrix like arrangement of the modules within the interior cavity, the at least one power output module and the at least one control module preferably comprise at least one optical communication unit on each of the four sides of the circumferential walls, such that data may be relied via optical signals to neighbouring modules on all four sides.

Preferably, the at least one power input module also comprises at least one optical communication unit.

The at least one optical communication unit may be powered directly with power from the power bus via an electrical connection of the at least one optical communication unit with the at least two contact elements. Preferably, the at least one optical communication unit is powered through a power supply of the respective module or through auxiliary power which is supplied by at least one conducting element of the power bus, as is explained in more detail further below.

Each power output module sends data recorded from its metering device via the optical communication unit to the optical communication unit of a neighbouring module. If this module is the control module, the data may be relayed via the external communication interface, wherein said data may optionally be preliminary edited or transformed by a control unit of the control module prior to being relayed by the external communication interface to an external device.

If the neighbouring module is a further power output module, then said power output module receives the data via an optical communication unit and relays this data via another optical communication unit to a neighbouring module. Thus, data sent by a first power output module is relayed in the sense of a daisy chain through a number of further power output modules until it reaches the at least one control module. Of course, if any data is sent by the control module to a specific power output module, said data is relayed in the same manner by a daisy chain of optical signals between neighbouring power output modules until the data reaches the specific power output module. The same applies for any data sent to or from the at least one power input module in the case that the power input module comprises at least one optical communication module.

The power input module, the at least one control module and/or the at least one power output module may comprise additional elements, such as e.g. a status indicator in the form of at least one LED, at least one fuse or circuit breaker, etc.

The power distribution unit may comprise further modules which provide further functionalities to the power distribution unit. For example, the power rail may comprise an overvoltage protection module which is able to clamp any voltage surges.

Preferably, said housing is a longitudinal housing wherein the at least two conducting elements span along a longitudinal axis of the interior cavity and the modules may be arranged next to each other along the longitudinal axis of the interior cavity.

The longitudinal housing of the power rail preferably has a cross section in the shape of the letter "U". This means that the interior cavity is bordered by two longitudinal side walls as well as a longitudinal base wall. In this way, the interior cavity is open on the first side which lies opposite of the longitudinal base wall. The two ends of the housing may be open or closed. Such a shape provides an interior cavity which spans the entire length of the longitudinal housing of the power rail. The term longitudinal is understood in the present invention to mean that an element has a considerably greater dimension in one spatial direction compared to the other two spatial directions.

In the case of a longitudinal housing, the modules have a first dimension which substantially corresponds to the distance between the two longitudinal side walls of the longitudinal housing, i.e. such that a module takes up the entire space of the interior cavity between the two longitudinal side walls of the longitudinal housing. In other words, each module spans the entire width of the interior cavity in a direction which is perpendicular to the longitudinal axis of said interior cavity.

In the case of a longitudinal housing, the modules are preferably further sized such that each module only takes up a fraction of the total length of the interior cavity, i.e. of the dimension of the interior cavity which lies in the direction of the longitudinal axis. In this way, a multiplicity of modules may be inserted into said interior cavity along said longitudinal axis. In this case, the modules comprise matching surfaces such that all modules may be arranged next to each other without a substantial gap forming between two neighbouring modules.

In the case of a longitudinal housing, the first and the second side of the circumferential wall are preferably formed such as to match a form of the longitudinal walls of the interior cavity. The third and fourth sides which lay opposite to each other in the direction of the longitudinal axis once a module in inserted into the interior cavity are preferably formed such as to allow the insertion of modules next to each other. Preferably, said third and said fourth side have mating elements which allow a form fit connection between neighbouring modules.

In the case of a longitudinal housing, said at least one first means is preferably configured as one or more longitudinal grooves or channels which span(s) at least one wall of said longitudinal housing while the at least one second connection means is configured as one or more latches on a module which may be releasably inserted into said longitudinal groove(s) or channel(s). Such a configuration enables a module to be releasably (removably) connected at any given position along the longitudinal axis of the interior cavity.

Preferably said at least one power output module comprises a first and a second optical communication unit and a controller which is configured to relay data received from a first neighbouring module via the first optical communication unit to a second neighbouring module via the second optical communication unit or vice versa.

This allows the relay of data from one specific power output module to the at least one control module via the intermediary of the power output modules arranged between said specific power output module and said at least one control module in the sense of a daisy chain.

The first and second optical communication units are preferably configured such as to be able to communicate to an optical communication unit of a neighbouring module in duplex mode, i.e. each optical communication unit is able to send and to receive data via an optical signal. Thereby, preferably, the optical communication units are configured such as to operate in full-duplex mode. This means that each optical communication unit may send and receive data via optical signal simultaneously.

Further preferably, the optical communication units may be configured such as to operate in half-duplex mode, i.e. being able to send and receive data via optical signals, but not at the same time.

Alternatively, the optical communication units may be configured to operate in simplex mode only. This means that each optical communication unit of a module is capable of either sending or receiving data. In this case, the first optical communication unit may be configured to send data via an optical signal while the second optical communication unit of each module may be configured to receive data via an optical signal. The modules must thereby be provided with means which allow an insertion of the module in only one orientation, such that the first optical communication unit of any given module is aligned with a second optical communication unit of a neighbouring module.

Concurrently, the optical communication unit of the at least one control module and optionally of the at least one power input module must be configured according to the transmission mode of the optical communication units of the at least one power output module, hence either full-duplex, half-duplex or simplex.

Preferably, said optical signals are infrared signals. By using infrared signals as optical signals the effect of light noise by ambient light on the transfer of data between the optical communication modules may be reduced. Thus the signal to noise ratio may be improved.

Alternatively, the optical communication units may use other optical signals in order to transmit data, such as for example light in the visible spectrum or laser light of a defined wavelength.

In one embodiment used for simplex data communication, said first optical communication unit includes a photodetector and said second optical communication unit comprises a light emitting diode, wherein said at least one power output module and said at least one control module include means which allow the insertion of the module into the internal cavity in a single orientation.

Preferably, form-fit elements are used in order to allow the insertion of the at least one power output module, of the at least one control module as well as optionally also of the power input module into the interior cavity in a single orientation. For example, each of said modules may comprise form fit elements on the third and fourth side of their circumferential walls which allows the arrangement of two modules next to each other in a single orientation only. Alternatively, said at least one first and said at least one second connection elements may be configured such that any module may only be releasable connected within said interior cavity in a single orientation.

Preferably, said first optical communication unit and said second communication unit each comprise a photodetector and a light emitting diode. Such a configuration allows data transfer in full-duplex and/or semi-duplex form.

In both cases, the light emitting diode as well as the photodetector is selected according to the type of optical signals to be used, e.g. for the emission and reception of infrared signals or signals in the visible light spectrum.

The photodetector preferably is a photodiode or a phototransistor.

The control unit of the at least one control module as well as the controller of the at least one power output module and eventually a controller of the power input module are configured such as to control the light emitting diode to generate an optical signal which is strong enough to be transmitted to and to be received by the at least one optical communication unit of a neighbouring module. For example, the strength of the signal may be adjusted manually or automatically by the controller or control unit of the modules, e.g. by means of an initial signal strength detection routine which is carried out periodically or as part of a start-up sequence after a module has been inserted into the interior cavity.

The at least one optical communication unit may further comprise an amplifier which amplifies the signal received by the photodetector.

Irrespective of the data transfer mode and the kind of optical signal used, the optical communication units may comprise at least one baffle which optically shields the at least one optical communication unit of each module. Preferably, the at least one baffle is configured such as to shield an optical line of sight of the at least one optical communication unit of a module to the at least one optical communication unit of a neighbouring module from any outside interference, such as e.g. ambient light. Further preferably, light guides, such as optical fibres or the like may be used in order to guide the optical signals between the at least one optical communication unit of neighbouring modules.

Further, the at least one optical communication unit may comprise additional optical means, such as polarizers and/or lenses. If neighbouring modules are arranged at a greater distance from each other, the optical communication devices of these neighbouring modules may be connected by means of an optical fibre, light pipe, etc.

Preferably, said power bus comprises six conducting elements defining a neutral and an earth conductor, three conductors for three live phases as well as a conductor for auxiliary power.

With such a configuration, the power bus is capable of conveying polyphase power with up to three phases and to provide for a neutral and an earth conductor. The auxiliary power may be used to provide electric power to the modules at a different voltage. This auxiliary power may for example be used to power the optical communication units, the microcontroller of the at least one control module, the metering device of the at least one power output module, etc.

In special cases, while the three phase conductors may carry polyphase AC power, the auxiliary power conductor may carry DC power.

The auxiliary power may also be used in order to trigger a reset or recycle (reboot) of the modules, e.g. by a short interruption of the auxiliary power.

This configuration of the power bus may also be used in connection with power distribution units where data communication between modules does not rely on optical signals. Hence, a power bus with six conducting elements may be used in connection with any known type or configuration of a power distribution unit known in the art, for example also with power distribution units where data transfer between modules is carried out by means of a data bus comprising a multiplicity of electrical conductor elements which establish at least one data transfer link between modules.

Preferably, the at least one control module comprises a power supply unit to provide auxiliary power to the auxiliary power conductor.

Alternatively, of course, auxiliary power might also be provided by the power input module, by a separate auxiliary power module or by any other module equipped with a power supply unit.

The at least two conductors preferably are in the form of at least two longitudinal bars made of a conducting material arranged parallel to each other.

In the case of a longitudinal housing, said at least two longitudinal bars are arranged along the longitudinal axis of the interior cavity.

This allows for a very simple configuration of the at least two conductors. Preferably, the longitudinal bars are made of copper or aluminium. However, the at least two longitudinal bars may be made of any suitable conducting material, e.g. any conducting metal, conducting polymer or conducting carbon material known in the art.

In this case, the at least two contact elements of the modules may be configured as current collectors or contact pins which are brought into physical contact with the at least two longitudinal bars when a module is inserted into the interior cavity. Preferably, the at least two contact elements are pre-stressed in a direction of the at least two longitudinal bars once a module is inserted into the interior cavity, e.g. by means of a spring element or the like.

The at least two longitudinal bars are preferably dimensioned such as to be able to carry an electric current of at least 60 A, preferably of at least 100 A.

Preferably, the at least two longitudinal bars are arranged spaced to each other, e.g. in a direction perpendicular to the longitudinal axis of the interior cavity when the housing is a longitudinal housing, such as to provide sufficient electric isolation between neighbouring longitudinal bars.

Preferably, the at least two longitudinal bars comprise at least one groove extending along the length of each longitudinal bar. In this case, the at least two contact elements of the modules are configured as blades which are insertable into said grooves. Such a configuration allows a better physical and hence electrical contact of the at least two contact elements with the at least two longitudinal bars.

In order to increase the safety of the power rail, the at least two longitudinal bars may be covered by an insulating material which comprises a longitudinal opening providing access to said grooves of the at least two longitudinal bars. Hence, accidental touching of any of the at least two bars by a technician or user of the power distribution unit is averted.

In order to further increase the safety of the power rail, it is envisaged to provide the bars serving as earth and neutral conductors closer to the open first side of the interior cavity, such that these two conductors are contacted by the respective contact elements prior to any contact of a contact element with the at least one remaining conductor conducting a "hot" phase of the electric power.

The present application further relates to a power output module for a power distribution unit having a modular construction, preferably according to any embodiment described above. Said power output module comprises at least one power socket electrically connected to at least two contact elements as well as a metering device for metering at least one power parameter of the power transmitted from said at least two contact elements to said at least one power socket. Said power output module comprises at least one optical communication unit which sends and/or receives data via optical signals.

The present application further relates to a method for transmitting data from at least one power output module to at least one control module of a power distribution unit having a modular construction, preferably according to any embodiment disclosed above, wherein the data is transmitted via optical signals sent by at least one optical communication unit of the at least one power output module and received by at least one optical communication unit of the control unit.

Preferably, the control unit of the control module as well as the controllers of the at least one power output module is executing bus software adapted for data transmission via optical signal. This bus software preferably carries out a cyclic redundancy check on received data. If the received data fails this check, it is immediately re-transmitted in order to minimize communication latency. As each module is carrying out redundancy checks the reliability of data communication is shared among all modules and does not rely on a single module. The control module is preferably acting as master within the power distribution unit, while the at least one power output module is configured as slave. At start-up, the control module preferably initiates a discovery process in order to determine the configuration of the daisy chain, or, if the control module is arranged between two power output modules, of the two daisy chains on either side. The discovery process is initiated by the control module but propagates along the daisy chain by communication from module to neighbouring module. Preferably, the address assigned to each power output module corresponds to its position within the respective daisy chain. Preferably, the address of each module is assigned during the discovery process. Further, the control module is also configured such that it can initiate an upgrade process of its own software as well as of the software of the at least one power output module. The new software data is thereby preferably also propagated along the daisy chain from module to neighbouring module.

Other advantageous embodiments and combinations of features come out from the detailed description below and the entirety of the claims.

BRIEF DESCRIPTION OF THE DRAWINGS

The drawings used to explain the embodiments show.

FIG. 5 the power output module of FIG. 4 inserted into the interior cavity of the power rail;
FIG. 6 a schematic representation of a data transfer between the control module and another module.

In the figures, the same components are given the same reference symbols.

PREFERRED EMBODIMENTS

Figure 1:
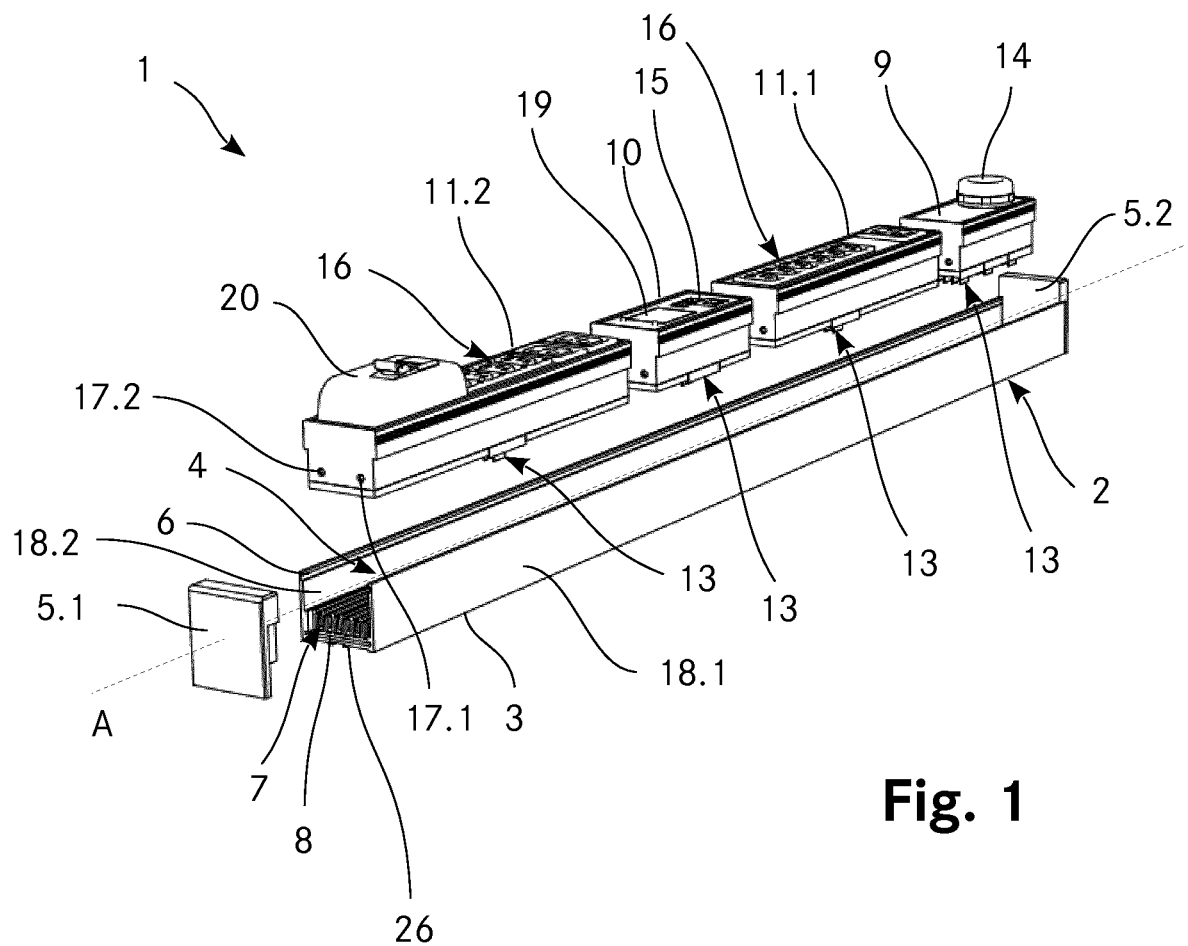
FIG. 1 an isometric view of an exemplary embodiment of a power distribution unit according to the present invention.

FIG. 1 shows an isometric view of an exemplary embodiment of a power distribution unit 1 according to the present invention. The power distribution unit 1 comprises a power rail 2 with a longitudinal housing 3. The longitudinal housing 3 has a cross section resembling the letter "U" and comprises two longitudinal side walls 18.1, 18.2 as well as a longitudinal base wall 26 which define an interior cavity 4. Said interior cavity 4 is open on a first side which lies opposite the longitudinal base wall 26. The longitudinal housing 3 spans along a longitudinal axis A, wherein in the shown embodiment the ends of the longitudinal housing 3 are closed by means of two end caps 5.1, 5.2 This means that the interior cavity 4 is bordered on five sides by said longitudinal side walls 18.1, 18.2, said end caps 5.1, 5.2 as well as by said longitudinal base wall 26. The two longitudinal side walls 18.1, 18.2 each comprise a first connection element 6 which is in the form of a channel in the embodiment shown.

The power rail 2 includes a power bus 7 with conducting elements 8. As will be explained in more detail further below, the power bus 7 of the embodiment as shown comprises six conducting elements 8. Said conducting elements 8 are in the form of longitudinal bars of a conducting material which are arranged parallel to each other along the longitudinal axis A.

Further, the power distribution unit 1 comprises a power input module 9 comprising a power inlet 14 which may be connected with a cable (not shown). The power input module 9 may be inserted into the interior cavity 4 of the power rail 2. The power input module 9 comprises second connection elements (not shown) which cooperate with the first connection elements 6 of the longitudinal housing 3 in order to releasably lock said power input module 9 within said interior cavity 4. Further, the power input module 9 comprises contact elements 13 which are brought into contact with the conducting elements 8 of the power bus 7 when the power input module 9 is inserted into the interior cavity 4. The power input module 9 may be connected to a power source by means of the cable which may be connected to the power inlet 14. The electrical power is relayed to the power bus 7 by means of the contact elements 13 which are in contact with the conducting elements 8 of the power bus 7. The electrical power may thereby be modified by the power input module 9, for example a voltage of the electrical power may be reduced by a transformer (not shown) arranged within said power input module 9. The power input module 9 includes appropriate circuitry (not shown) in order to relay the power from said power inlet 14 to said contact elements 13.

The power distribution unit 1 further comprises a control module 10 which may be inserted into the interior cavity 4 of the power rail 2. Similar to the power input module 9, the control module 10 comprises second connection elements (not shown) which cooperate with the first connection elements 6 of the longitudinal housing 3 in order to releasable lock said control module 10 within said interior cavity 4. Further, the control module 10 comprises contact elements 13 which are brought into contact with the conducting elements 8 of the power bus 7 when the control module 10 is inserted into the interior cavity 4. By this contact the control module 10 may be supplied with the required electrical power. The control module 10 comprises a microcontroller (not shown) which allows to process, prepare and use data. Further, the control module comprises an external communication interface 15 in order to be able to transfer data to an external device (not shown). In the embodiment shown, the external communication interface 15 includes one plug of the RJ-45 type in order to e.g. connect the control module 10 to an Ethernet network. Additionally, the external communication interface includes two plugs of the USB type.

The control module 10 also comprises a display 19, such as for example a TFT or LCD display in order to display data such as the actual power consumption. The display 19 may feature touchscreen capabilities, such that a user may perform certain inputs by means of the display 19.

The embodiment of the exemplary power distribution unit 1 as shown further comprises two power output modules 11.1, 11.2. Each of the two power output modules 11.1, 11.2 includes a plurality of power sockets 16. The power sockets 16 are configured to receive plugs of power cables (cords) of electrical devices (not shown), in particular server units. The power output modules 11.1, 11.2 may be inserted into the interior cavity 4 of the power rail 2. Similar to the power input module 9, the power output modules 11.1, 11.2 comprise second connection elements (not shown) which cooperate with the first connection elements 6 of the longitudinal housing 3 in order to releasably lock the power output modules 11.1, 11.2 within said interior cavity 4. Further, the power output modules 11.1, 11.2 comprise contact elements 13 which are brought into contact with the conducting elements 8 of the power bus 7 when the respective power output module 11.1, 11.2 is inserted into the interior cavity 4.

A second power output module 11.2 of the two power output modules 11.1, 11.2 shown in FIG. 1 comprises a protective power (circuit) breaker 20. Both of the power sockets 16 of the power output modules 11.1, 11.2 are electrically connected to the contact elements 13 in order to relay (conduct) electric power (current) from said power rail 7 to said power sockets 16. Each of the power output modules 11.1, 11.2 further includes a metering device (not shown) which a enables one or more parameters of the power relied relayed (conducted) to each of said power sockets 16 to be measured (metered). For example, the metering device may measure the wattage.

The power input module 9, the control module 10 as well as both power output modules 11.1, 11.2 are sized and dimensioned such that they may be inserted into the interior cavity one next to each other along the longitudinal axis A.

Further, each of the power input module 9, the control module 10 as well as both power output modules 11.1, 11.2 include four optical communication units 17.1-17.4 (of which only the first optical communication unit 17.1 and the second optical communication unit 17.2 of the second power output module 11.2 are shown for perspective reasons in FIG. 1).

The optical communication units 17.1-17.4 allow to transmit data via an optical signal between the modules, as is explained in further detail in connection with FIG. 6.

Figure 2:
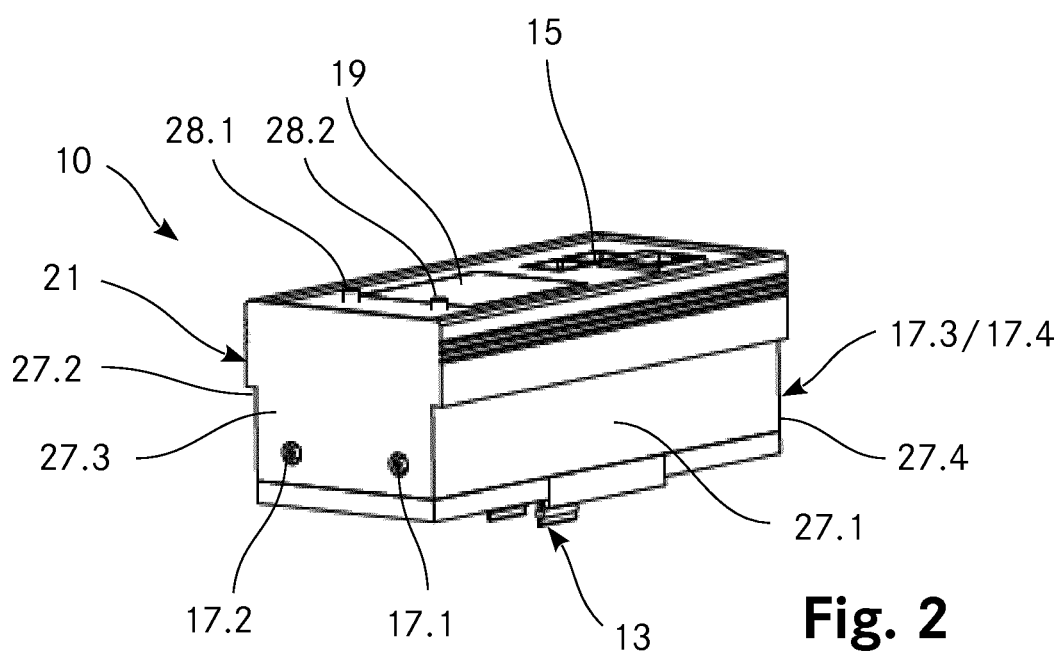
FIG. 2 a detailed view of the control module of the power distribution unit according to FIG. 1.

FIG. 2 shows a detailed view of the control module 10 of the power distribution unit 1 according to FIG. 1. The control module 10 comprises a housing 21 of the general rectangular shape. Said housing comprises a circumferential wall with a first side 27.1, a second side 27.2, a third side 27.3 and a fourth side 27.4. The first side 27.1 and the second side 27.2 are configured such as to partially cooperate with the longitudinal side walls of the housing 3 of the power rail 2. On the underside, the contact elements 13, which are in the form of blades in the embodiment as shown, are more clearly visible.

On the third side 27.3 of the housing 21 the first optical unit 17.1 and the second optical unit 17.2 are located. On the fourth side 27.4, which lies opposite to the third side 27.3 the third optical unit 17.3 and the fourth optical unit 17.4 are located. It is to be noted that the third side 27.3 and the fourth side 27.4 of each of the modules 9, 10, 11.1, 11.2 of the power distribution unit 1 are configured in the same way such that the first optical communication unit 17.1 of a first module lies in a direct line-of-sight to the third optical communication unit 17.3 of a second module and that the second optical communication unit 17.2 of the first module lies in a direct line-of-sight to the fourth optical communication unit 17.4 of the second module. Further, this configuration allows to arrange a plurality of modules next to each other wherein the third side 27.3 of a module faces the fourth side 27.4 of a neighbouring module.

On a top side, the control module 10 comprises the display 19, the external communication interface 15 as well as two buttons 28.1, 28.2 used to input commands into the control unit 10 by a user.

Figure 3A:
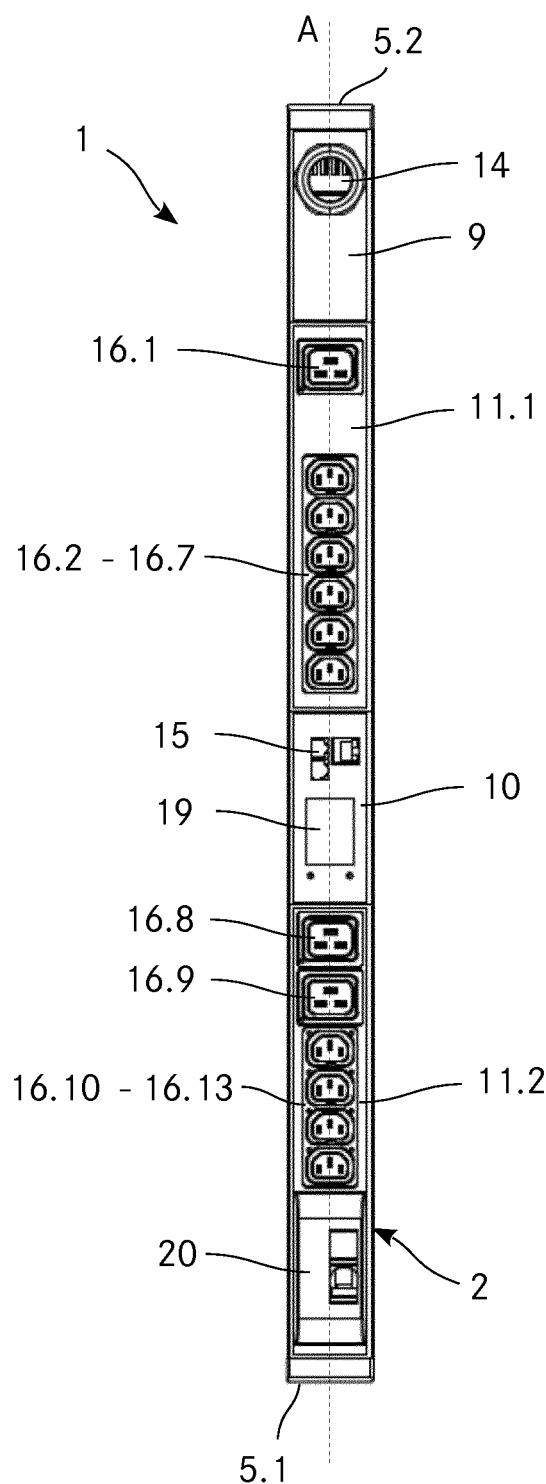
FIGS. 3a, 3b show a top view of the power distribution unit of FIG. 1.
Figure 3B:
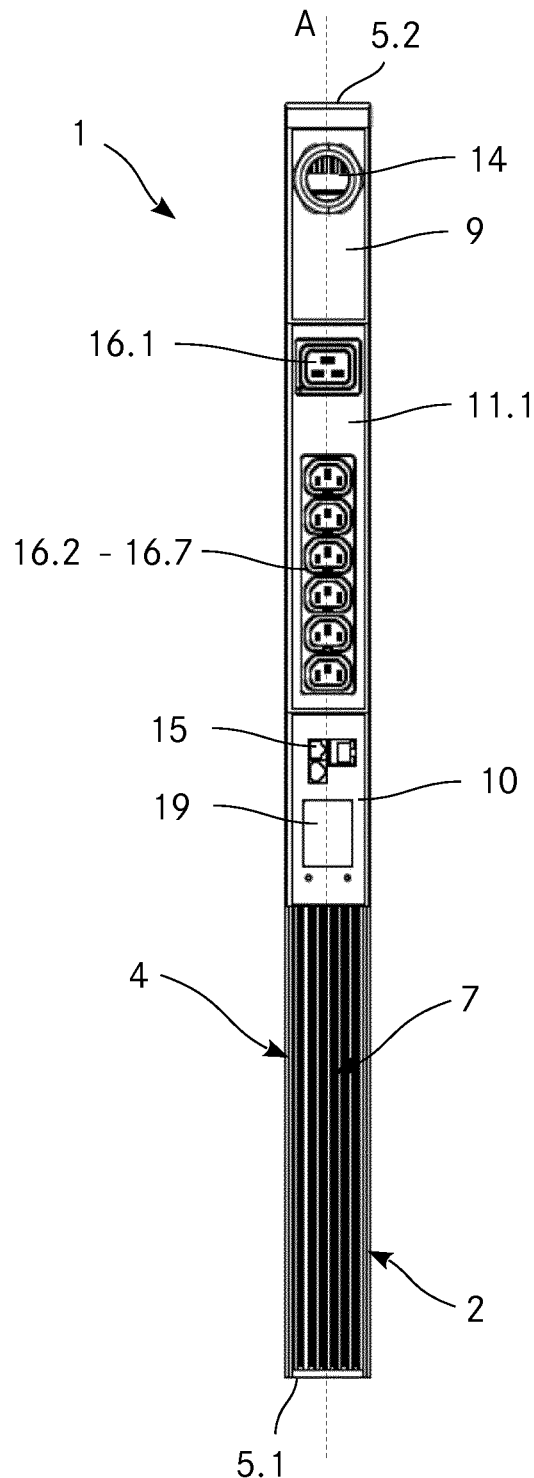

FIGS. 3a and 3b show a top view of the power distribution unit 1 of FIG. 1. FIG. 3a shows the power distribution unit 1 with all modules 9, 10, 11.1, 11.2 inserted into the cavity 4 while FIG. 3b shows the power distribution unit 1 without the second power output module 11.2. Removal of the second power output module 11.2 reveals the power bus 7 located within the interior cavity 4. As may be well seen on this figure, the power bus 7 comprises six conducting elements 8 in the form of longitudinal bars of a conducting material which are arranged parallel to each other and which extend along the longitudinal axis A.

As is further seen on these figures, the first power output module 11.1 comprises seven power sockets 16.1-16.7 of two different socket configurations. The second power output module 11.2 comprises six power sockets 16.8-16. 13 of two different socket configurations.

Further, as may be derived from FIGS. 3a and 3b the modules 9, 10, 11.1, 11.2 span the entire width of the longitudinal housing 3, i.e. the entire dimension of the longitudinal housing 3 in a direction perpendicular to the longitudinal axis A. Thereby, the modules 9. 10, 11.1, 11.2 are arranged one next to each other along the longitudinal axis A.

Figure 4:
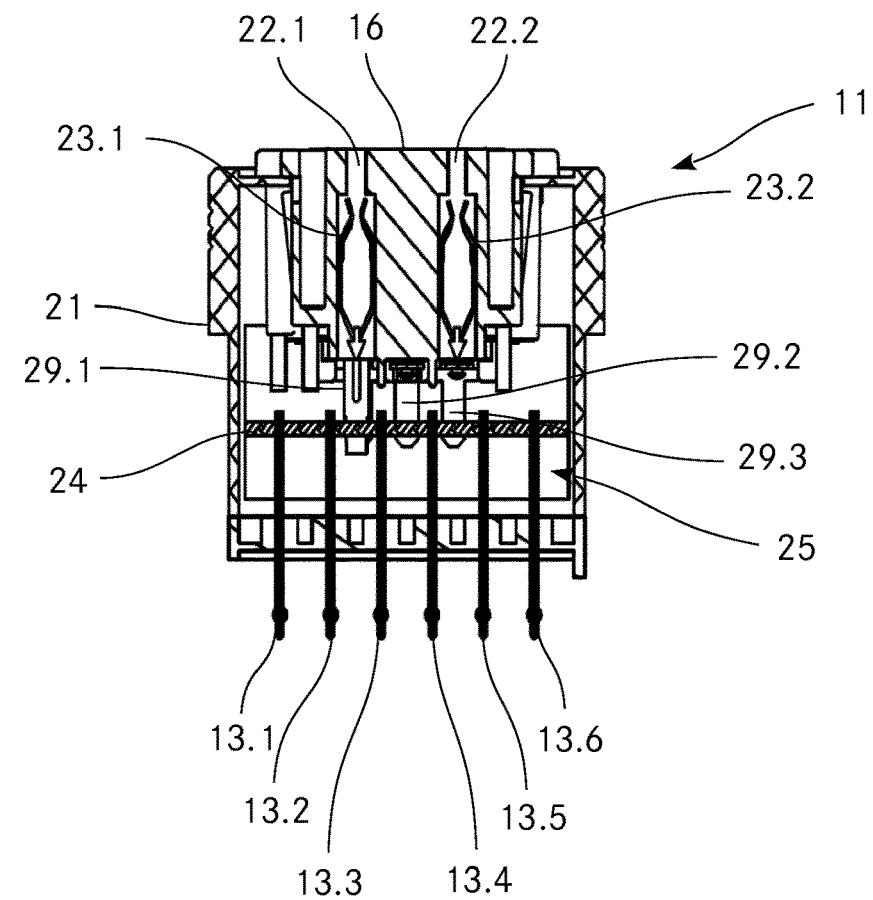
FIG. 4 a cross-sectional view through one of the power output modules and a side view of the power rail.
Figure 4:
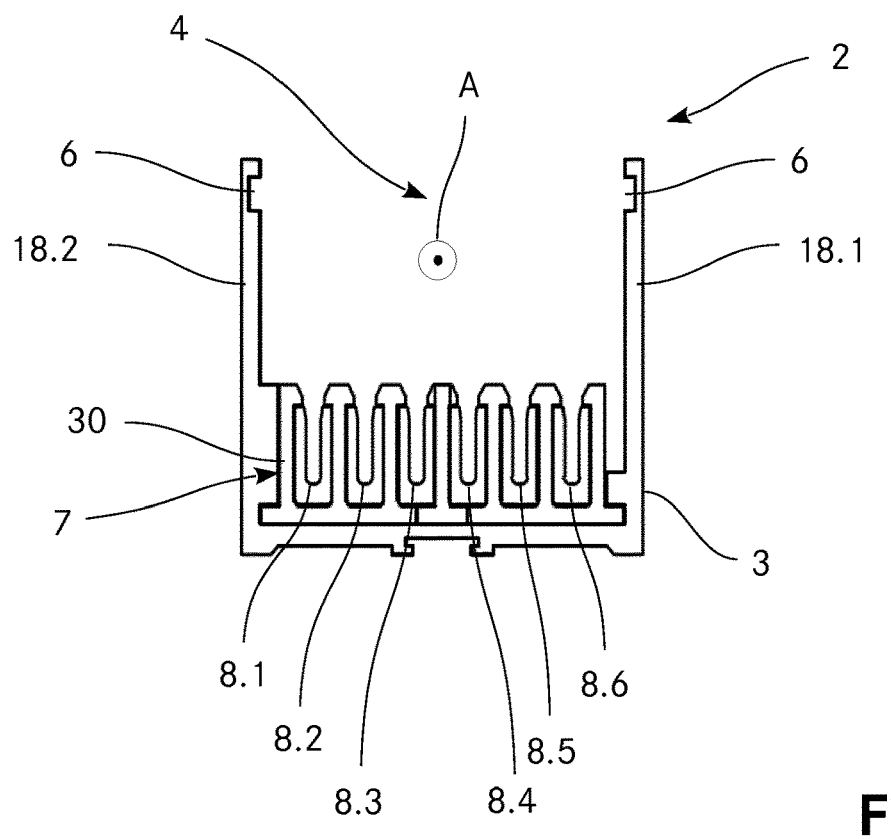

FIG. 4 is a cross-sectional view through one of a power output module 11 and a side view of a power rail 2. On an underside of the power output module 11 six contact elements 13.1-13.6 are arranged. The contact elements 13.1-13.6 are in the form of blades which span in the direction of the longitudinal axis A when the module 11 is inserted into the interior cavity 4. The contact elements 13.1-13.6 extend into an interior space 25 within the housing 21 of the power output module 11. Conductive elements which are configured in the form of a printed board 24 and connection lugs 29.1-29.3 electrically connect the contact elements 13.1-13.6 with the power socket(s) 16. Alternatively, the conductive elements may further comprise a circuit breaker e.g. located between the contact elements 13.1-13.6 and the connection lugs 29. 1-29.3.

Each power socket 16 includes socket openings 22. 1, 22.2 into which lugs of a plug may be inserted. In the embodiment as shown in FIG. 1, each power socket 16 comprises three socket openings, of which two socket openings 22.1, 22.2 are seen on the cross-section according to FIG. 4. Within each socket opening 22. 1, 22.2 a contact sleeve 23.1, 23.2 is arranged. The contact sleeves 23. 1, 23.2 enable a reliable electric contact to pins of a plug inserted into the socket openings 22. 1, 22.2.

The power rail 2 comprises the power bus 7 with six conducting elements 8.1-8.6 in the form of longitudinal bars of a conducting material which are arranged parallel to each other and which extend along the longitudinal axis A. Each longitudinal bar of conducting material comprises a groove extending the length thereof. The groove is dimensioned such that a contact element 13.1-13.6 of a module 9, 10, 11.1, 11.2 may be inserted therein such as to transfer power between said respective conducting element 8.1-8.6 and said contact element 13.1-13.6. The conducting elements 8.1-8.6 are spaced from each other in a direction perpendicular to the longitudinal axis A. The spacing of the conducting elements 8. 1-8.6 is such that it corresponds to the spacing of the contact elements 13.1-13.6 of the modules 9, 10, 11.1, 11.2.

The conducting elements 8.1-8.6 are arranged within an insert 30 of isolating material, such that a protrusion of the isolating material is arranged between each of the neighbouring conducting elements 8.1-8.6. This allows for a proper separation of each of the conducting elements 8.1-8.6 from each other as well as a safe electric separation of the conducting elements 8. 1-8.6 from the longitudinal housing 2.

FIG. 5 shows the power output module 11 of FIG. 4 inserted into the cavity 4 of the power rail 2. As may be seen, each contact element 13.1-13.6 snuggly fits into a groove of one of the conductive elements 8.1-8.6. Further, it is to be noted that the housing 21 of the power output module 11 is sized and dimensioned such that a part of it may be snuggly inserted into the interior cavity 4 of the longitudinal housing 3. As an example of a means for requiring insertion of the power output module 11 into the interior cavity 4 of the power rail 2 in a single orientation, a projection 12.1 is provided on one side of the power output module 11 and fits into a corresponding groove 12.2 defined in the power rail 2.

By means of (via) the contact between the contact elements 13.1-13.6 and the conductive elements 8.1-8.6, electric power (current) may be transmitted from the power bus 7 to the power output module 11. Said electric power (current) is then relayed (conducted) by means of (via) the circuit board 24 and the connection lugs (terminals) 29.1-29.3 to the power socket 16. Power transmission to the control module 10 is realized similarly by (via) the contact of the contact elements 13.1-13.6 of the control module 10 with the corresponding conductive elements 8.1-8.6.

The conducting elements 8.1-8.6 of the power bus 7 are fed with the electrical power by means of the contact of the contact elements 13.1-13.6 of the power input module 9 with the conducting elements 8. 1-8.6.

The power bus 7 as well as the modules 9, 10, 11.1, 11.2 according to the embodiment of the present invention shown comprise both of six conducting elements 8.1-8.6 and six contact elements 13.1-13.6. A first conducting element 8.1 and a corresponding first contact element 13.1 are configured as an earth (ground) conductor, a second conducting element 8.2 and a corresponding second contact element 13.2 are configured as neutral conductor while third to fifth conducting elements 8.3-8.5 and respective contact elements 13.3-13.5 are configured as phase conductors. As such, the power distribution unit 1 as shown may be used in connection with electrical power (electric current) having up to three phases L1 to L3. A sixth conducting element 8.6 and a respective sixth contact element 13.6 carry (conduct) auxiliary electrical power (auxiliary electric current) which may be used e.g. to power the metering devices of the power output devices 11.1, 11.2, the microcontroller of the control module 10 or any further electronic component integrated within one of the modules 9, 10, 11.1, 11.2.

FIG. 6 is a schematic representation of a data transfer between the control module 10 and another module, specifically shown for example as a second power output module 11.2. At first, data is prepared by a control unit of the control module 10, wherein said data comprises an address of the power output module 11.1-11.4 said data is intended for. The data is then sent in a first step (represented by an arrow with the number 1. in a circle on the figure) through an optical signal generated by the first optical communication unit 17.1 of the control module 10, which is configured as sender and thus comprises a diode to emit the optical signal, e.g. in the infrared spectrum. This data is received by the third optical communication unit 17.3 of a first power output module 11.1 which is configured as a receiver and thus comprises a photodetector, e.g. in the form of a photodiode or phototransistor. The data is processed by a controller of the first power output module 11.1. As the data should be sent to the second power output module 11.2, the data comprises an address which does not correspond to the address of the first power output module 11.1. Hence, the controller of the first power output module 11.1 forwards the data to the next neighbouring power output module, which happens to be the second power output module 11.2 in the example shown. The data is send by means of an optical signal emitted from the first optical communication unit 17.1 of the first power output module 11.1. Said optical signal is received by the third optical communication unit 17.3 of the second power output module 11.2. This second step is represented by an arrow marked by the number 2. in a circle on FIG. 6. As the address included in the data corresponds to address of the second power output module 11.2, a controller of the second power output module 11.2 can determine that the data is intended for this module. The data is then further processed by the controller. The data may for example contain a command to send the actual wattage of a certain power socket 16 of said second power output module 11.2 back to the control module 10.

The transmission of data from the second power output module 11.2 to the control module 10 happens in a similar fashion as the data transfer from the control module 10 to the second power output module 11.2, albeit in reversed order. The data is prepared by the controller of the second power output module 11.2, wherein the data comprises an address identifying the control module 10 as recipient of the data. The data is sent as optical signal by means of a fourth optical communication unit 17.4 of the second power output module 11.2 which is configured as sender and thus comprises a diode to emit the optical signal. This data is received by the second optical communication unit 17.2 of the first power output module 11.1 which is configured as a receiver and thus comprises a photodetector, e.g. in the form of a photodiode or phototransistor. This third step is represented by an arrow marked by the number 3. in a circle on FIG. 6. The data is processed by the controller of the first power output module 11.1.

As the data is intended for the control module 10, the controller of the first power output module 11.1 forwards the data to the next neighbouring module, which happens to be the control module 10 in the example shown. The data is send by means of an optical signal emitted from the fourth optical communication unit 17.4 of the first power output module 11.1. Said optical signal is received by the second optical communication unit 17.2 of the control module. This fourth step is represented by an arrow marked by the number 4. in a circle on FIG. 6. As the address included in the data corresponds to address of the control module, the control unit of the control module 10 can determine that the data is intended for this module. The data is then further processed by the microcontroller.

In the same way, data may be sent from the control module 10 to the third power output module 11.3, the fourth power output module 11.4 or to the power input module 9 or vice versa.

The data is transmitted via optical signal(s) by means of (via) the optical communication units 17.1-17.4 of each of the modules 9, 10, 11.1-11.4 in the sense of a "linear daisy chain" where data is passed from one of the modules 9, 10, 11.1-11.4 to a neighbouring one or neighbouring ones of the modules 9, 10, 11.1-11.4 until the data reaches the intended one of the modules 9, 10, 11.1-11.4.

In the example shown, the control module 10 is located about in the middle of all modules 9, 10, 11.1-11.4. Hence, the control module 10 may send or receive data from two different sides. In this case, the power distribution unit 1 comprises a first daisy chain I comprising the first power output module 11.1 and the second power output module 11.2 as well as a second daisy chain II comprising the third power output module 11.3, the fourth power output module 11.4 and the power input module 9.

The number of power output modules 11 may be varied depending on the specific needs. For example, a power distribution unit 1 according to the present invention may comprise more than four power output modules. Therefore the length of the "daisy chains" may also vary. In theory, there is no limit as to the number of power output modules present in any of the "daisy chains". However, said number will be limited due to dimensional constraints, as the power distribution unit needs to keep a useful maximal size.

The invention claimed is:

1. A power distribution unit having a modular construction comprising:
   a power rail having a housing that defines an interior cavity,
   at least one first connection element and a power bus having at least two conducting elements, and
   a plurality of modules formed and sized to be inserted into said interior cavity, each of said modules comprising:
      at least one second connection element configured to cooperate with the at least one first connection element in order to releasably connect each module with the housing, and
      at least two contact elements configured to be connected to or brought into contact with said at least two conducting elements upon insertion of one of the modules into said interior cavity, said plurality of modules including:
   a) a power input module comprising at least one power inlet, said power inlet being connectable to a power source, said power input module further including circuitry configured to relay power from the power inlet to the at least two contact elements of the power input module;
   b) at least one control module including a microcontroller and at least one external communication interface configured to transfer data to external devices; and
   c) at least one power output module comprising at least one power socket electrically connected to the at least two contact elements, and a metering device configured to measure at least one power parameter of the power and/or at least one switch configured to selectively interrupt the power transmitted from said at least two contact elements to said at least one power socket,
   wherein said at least one control module and said at least one power output module each comprise at least one optical communication unit configured to send and/or receive data via optical signals through air between at least one of the power input module, the at least one control module and the at least one power output module and another one of the power input module, the at least one control module and the at least one power output module.

2. The power distribution unit according to claim 1, wherein:
   said housing is a longitudinal housing,
   said at least two conducting elements span along a longitudinal axis of the interior cavity, and
   the modules are arranged next to each other along the longitudinal axis of the interior cavity.

3. The power distribution unit according to claim 2, wherein said at least one power output module comprises:
   a first and a second optical communication unit, and
   a controller configured to relay data received from a first neighbouring module via the first optical communication unit to a second neighbouring module via the second optical communication unit or vice versa, and
   wherein said optical signals are infrared signals.

4. The power distribution unit according to claim 3, wherein the at least two conducting elements of said power bus comprise:
   six conducting elements respectively defining a neutral conductor, a ground conductor, three conductors for three live phases, and a conductor for auxiliary power, and
   wherein the at least one control module comprises a power supply unit configured to provide auxiliary power to the auxiliary power conductor.

5. The power distribution unit according to claim 4, wherein said at least two conducting elements are in the form of at least two longitudinal bars that are made of a conducting material and are arranged parallel to each other.

6. The power distribution unit according to claim 1, wherein said at least one power output module comprises:
   a first and a second optical communication unit, and
   a controller configured to relay data received from a first neighbouring module via the first optical communication unit to a second neighbouring module via the second optical communication unit or vice versa.

7. The power distribution unit according to claim 6, wherein:
   said first optical communication unit includes a photodetector,
   said second optical communication unit comprises a light emitting diode, and said at least one power output module includes means for requiring insertion of the at least one power output module into the interior cavity in a single orientation.

8. The power distribution unit according to claim 6, wherein said first optical communication unit and said second communication unit each comprise a photodetector and a light emitting diode.

9. The power distribution unit according to claim 1, wherein said optical signals are infrared signals.

10. The power distribution unit according to claim 9, wherein:
said first optical communication unit includes a photodetector,
said second optical communication unit comprises a light emitting diode, and
at least one power output module includes means for requiring insertion of the at least one power output module into the interior cavity in a single orientation.

11. The power distribution unit according to claim 9, wherein said first optical communication unit and said second communication unit each comprise a photodetector and a light emitting diode.

12. The power distribution unit according to claim 1, wherein the at least two conducting elements of said power bus comprise:
six conducting elements respectively defining a neutral conductor, a ground conductor, three conductors for three live phases, and a conductor for auxiliary power.

13. The power distribution unit according to claim 12, wherein the at least one control module comprises a power supply unit configured to provide auxiliary power to the auxiliary power conductor.

14. The power distribution unit according to claim 1, wherein said at least two conducting elements are in the form of at least two longitudinal bars that are made of a conducting material and are arranged parallel to each other.

15. The power distribution unit according to claim 1, wherein the microcontroller and the at least one external communication interface of the at least one control module are further configured to receive data from external devices.

16. A power output module for a power distribution unit having a modular construction, comprising:
at least one power socket electrically connected to at least two contact elements, and
a metering device configured to measure at least one power parameter of the power transmitted from said at least two contact elements to said at least one power socket,
wherein said power output module comprises at least one optical communication unit configured to send data measured by the metering device via optical signals through air from the power output module to another module disposed adjacent to the power output module in the power distribution unit.

17. The power module according to claim 16, wherein the metering device is configured to measure one or more parameters selected from the group consisting of voltage, amperage and wattage.

18. A method for transmitting data from a first power output module to at least one control module of a power distribution unit having a modular construction, comprising:
positioning the first power output module and the at least one control module on the power distribution unit such that at least one optical communication unit of the first power output module and at least one optical communication unit of the at least one control module are aligned along a straight line; and
transmitting the data via one or more optical signals from the at least one optical communication unit of the first power output module and to the at least one optical communication unit of the at least one control module at least in part through air.

19. The method according to claim 18, wherein:
one or more additional power output modules is (are) positioned between the first power output module and the at least one control module on the power distribution unit and
the data sent by the first power output module is relayed via the additional power output module(s) in a linear daisy chain of optical signals at least in part(s) through air until the data reaches the at least one control module.

20. The method according to claim 19, wherein:
the one or more additional power output modules each include at least one optical communication unit and
the at least one optical communication unit(s) of the one or more additional power output modules is (are each) aligned along the straight line.

* * * * *